(12) United States Patent
Hagiwara (10) Patent No.: US 7,650,002 B2
(45) Date of Patent: Jan. 19, 2010

(54) DIGITAL COMPRESSOR FOR MULTI-CHANNEL AUDIO SYSTEM

(75) Inventor: Hideki Hagiwara, Hamamatsu (JP)

(73) Assignee: Yamaha Corporation, Hamamatsu-Shi (JP)

( * ) Notice: Subject to any disclaimer, the term of this patent is extended or adjusted under 35 U.S.C. 154(b) by 884 days.

(21) Appl. No.: 10/617,186

(22) Filed: Jul. 9, 2003

(65) Prior Publication Data

US 2004/0008851 A1 Jan. 15, 2004

(30) Foreign Application Priority Data

Jul. 9, 2002 (JP) ............................. 2002-199506

(51) Int. Cl.
*H03G 3/00* (2006.01)
*H03G 7/00* (2006.01)
*H03G 9/00* (2006.01)

(52) U.S. Cl. .................. 381/104; 381/106; 381/109; 381/102; 715/727

(58) Field of Classification Search ................ 381/98, 381/102–109, 57, 123; 715/725, 727
See application file for complete search history.

(56) References Cited

U.S. PATENT DOCUMENTS

| | | | | |
|---|---|---|---|---|
| 5,054,077 A | * | 10/1991 | Suzuki | ............... 381/109 |
| 5,204,969 A | * | 4/1993 | Capps et al. | ............... 704/278 |
| 5,617,480 A | * | 4/1997 | Ballard et al. | ............... 381/98 |
| 5,680,464 A | * | 10/1997 | Iwamatsu | ............... 381/18 |
| 5,848,171 A | * | 12/1998 | Stockham et al. | ............... 381/321 |
| 6,084,974 A | * | 7/2000 | Niimi | ............... 381/104 |
| 6,442,278 B1 | | 8/2002 | Vaudrey et al. | |
| 6,501,717 B1 | * | 12/2002 | Yamazaki | ............... 369/47.16 |
| 6,650,755 B2 | * | 11/2003 | Vaudrey et al. | ............... 381/18 |
| 7,190,292 B2 | * | 3/2007 | Bizjak | ............... 341/139 |
| 7,212,640 B2 | * | 5/2007 | Bizjak | ............... 381/106 |
| 7,363,096 B2 | * | 4/2008 | Wiser et al. | ............... 700/94 |
| 2002/0131611 A1 | * | 9/2002 | Hoover et al. | ............... 381/123 |

FOREIGN PATENT DOCUMENTS

| | | | | |
|---|---|---|---|---|
| GB | 2 264 598 A | | 9/1993 | |
| GB | 2264598 A | * | 9/1993 | |
| JP | 04081100 A | * | 3/1992 | |
| JP | 05-244700 | | 9/1993 | |
| JP | 05244700 A | * | 9/1993 | |
| JP | 2000-004396 | | 1/2000 | |
| JP | 2001-023800 | | 1/2001 | |
| JP | 2001-218291 | | 8/2001 | |
| JP | 2001218291 A | * | 8/2001 | |

* cited by examiner

*Primary Examiner*—Devona E Faulk
(74) *Attorney, Agent, or Firm*—Morrison & Foerster LLP

(57) ABSTRACT

A level adjustment method is applicable to an audio processing apparatus having a plurality of amplifiers corresponding to three or more of input channels of an audio signal for amplifying signal levels of the respective input channels. The level adjustment method is carried out by a group arrangement process of arranging the plurality of the input channels into one or more group, and a group control process of controlling each group such as to decrease an amplification rate of all the amplifiers corresponding to the input channels belonging to the same group as a maximal one of the signal levels of the input channels belonging to the same group increases. Typically, the group arrangement process is applied to an audio signal of a surround system having at least six input channels including a left channel, a right channel, a left surround channel, a right surround channel, a center channel and an LFE channel.

18 Claims, 9 Drawing Sheets

DIGITAL COMPRESSOR FOR MULTI-CHANNEL AUDIO SYSTEM

BACKGROUND OF THE INVENTION

1. Technical Field of the Invention

The present invention relates to a level adjustment method, a level adjustment program, and an audio processing apparatus suitably used for a 5.1 channel sound system.

2. Prior Art

An audio processing apparatus such as a mixer is provided with effects such as a compressor that applies a specified signal processing to audio signals. Here, the compressor detects an input signal level and, if the detected level exceeds a specified value (threshold Th), attenuates the level for an excess portion to compress the dynamic range. The details are disclosed in Japanese Patent Application Laid-Open Publication No. 8-122366. In addition, there is provided a stereo compressor that detects one level from either or both of a left signal L and a right signal R, and controls the L and R levels based on the detected level.

On the other hand, there is provided a 5.1 channel mixer, making it possible to appropriately mix a plurality of input signals and generate a multi-channel signal.

However, the conventional stereo compressor can cooperatively process two channels at the most. Therefore, it is difficult to appropriately process multi-channel signals for use with the 5.1 channel sound system and the like.

SUMMARY OF THE INVENTION

The present invention has been made in consideration of the foregoing. It is therefore an object of the present invention to provide a level adjustment method, a level adjustment program, and an audio processing apparatus capable of appropriately selecting signals from multi-channel signals for processing.

In one aspect of the invention, a level adjustment method is applicable to an audio processing apparatus having a plurality of amplifiers corresponding to three or more of input channels of an audio signal for amplifying signal levels of the respective input channels. The level adjustment method comprises a group arrangement process of arranging the plurality of the input channels into one or more group, and a group control process of controlling each group such as to decrease an amplification rate of all the amplifiers corresponding to the input channels belonging to the same group as a maximal one of the signal levels of the input channels belonging to the same group increases.

Typically, the group arrangement process is applied to an audio signal of a surround system having at least six input channels including a left channel, a right channel, a left surround channel, a right surround channel, a center channel and an LFE channel. In such a case, the group arrangement process arranges all of the left channel, the right channel, the left surround channel, the right surround channel, the center channel and the LFE channel into one group. Otherwise, the group arrangement process arranges the input channels into a first group including the left channel, the right channel, the left surround channel, the right surround channel and the center channel, and a second group including the LFE channel. Otherwise, the group arrangement process arranges the input channels into a first group including the left channel, the right channel and the center channel, a second group including the left surround channel and the right surround channel, and a third group including the LFE channel. Otherwise, the group arrangement process arranges the input channels into a first group including the left channel and the right channel, a second group including the left surround channel and the right surround channel, a third group including the LFE channel, and a fourth group including the center channel.

Practically, the level adjustment method further comprises a band separation process of separating the respective input channels into a plurality of frequency bands, so that the group arrangement process and the group control process are applied to a respective one of the frequency bands.

Practically, the group control process comprises a detection process of detecting the maximal one of the signal levels of the input channels belonging to the same group, and an adjustment process of adjusting the amplification rate of all the amplifiers involved in the same group according to the detected maximal signal level such as to decrease the amplification rate as the maximal signal level increases. In such a case, the detection process further comprises a sample and hold process of successively sampling absolute values of the signal level of each input channel for a predetermined period and holding a greatest one of the sampled absolute values, so that the sampled and held greatest absolute value represents the signal level of the input channel. Further, the detection process detects a maximal one of the respective greatest absolute values sampled and held for the respective input channels of the same group, thereby determining the maximal signal level.

Practically, the adjustment process checks whether the maximal signal level of each of the groups exceeds a predetermined threshold level, and, when the maximal signal level of the group exceeds the threshold level, decreases the amplification rate of the group according to the excess amount. In such a case, the adjustment process smoothens a transition of the amplification rate around the threshold level according to a predetermined knee parameter.

Practically, the group control process includes a response control process that controls a response of the adjusting of the amplification rate relative to the detecting of the maximal signal revel according to predetermined attack and release parameters.

In another aspect of the invention, an audio processing apparatus comprises a plurality of amplifiers corresponding to three or more of input channels of an audio signal for amplifying signal levels of the respective input channels, a group arrangement section for arranging the plurality of the input channels into one or more group, and a group control section for controlling each group such as to decrease an amplification rate of all the amplifiers corresponding to the input channels belonging to the same group as a maximal one of the signal levels of the input channels belonging to the same group increases.

In a further aspect of the invention, a level adjustment program is provided for use in an audio processing apparatus having a processor and a plurality of amplifiers corresponding to three or more of input channels of an audio signal for amplifying signal levels of the respective input channels, the level adjustment program being executable by the processor for causing the audio processing apparatus to perform a group arrangement process of arranging the plurality of the input channels into one or more group, and a group control process of controlling each group such as to decrease an amplification rate of all the amplifiers corresponding to the input channels belonging to the same group as a maximal one of the signal levels of the input channels belonging to the same group increases.

In a still further aspect of the invention, a graphic user interface is installed in an audio processing apparatus having a plurality of amplifiers corresponding to three or more of input channels of an audio signal for amplifying signal levels of the respective input channels. The graphic user interface is designed for assisting the audio processing apparatus in performing a level adjustment method comprising a group arrangement process of arranging the plurality of the input channels into one or more group, and a group control process of controlling each group such as to decrease an amplification rate of all the amplifiers corresponding to the input channels belonging to the same group as a maximal one of the signal levels of the input channels belonging to the same group increases. The graphic user interface provides a visual symbol prompting the user to select desired grouping of the input channels at the group arrangement process, and another visual symbol prompting the user to input parameters effective to determine how the amplification rate is decreased according to the maximal signal level during the group control process. Typically, the parameters include a threshold parameter and a knee parameter, such that the group control process decreases the amplification rate when the maximal signal level exceeds a threshold level determined by the threshold parameter, and smoothens a transition of the amplification rate around the threshold level according to the knee parameter.

BRIEF DESCRIPTION OF THE DRAWINGS

FIGS. 3(*a*) and 3(*b*) are a configuration diagram showing an algorithm of a signal processing section, CPU, and the like.

FIGS. 8(*a*) through 8(*d*) show a configuration of a gain determination section.

DETAILED DESCRIPTION OF THE INVENTION

1. Hardware Configuration According to an Embodiment (1) Digital Mixer

Figure 1:
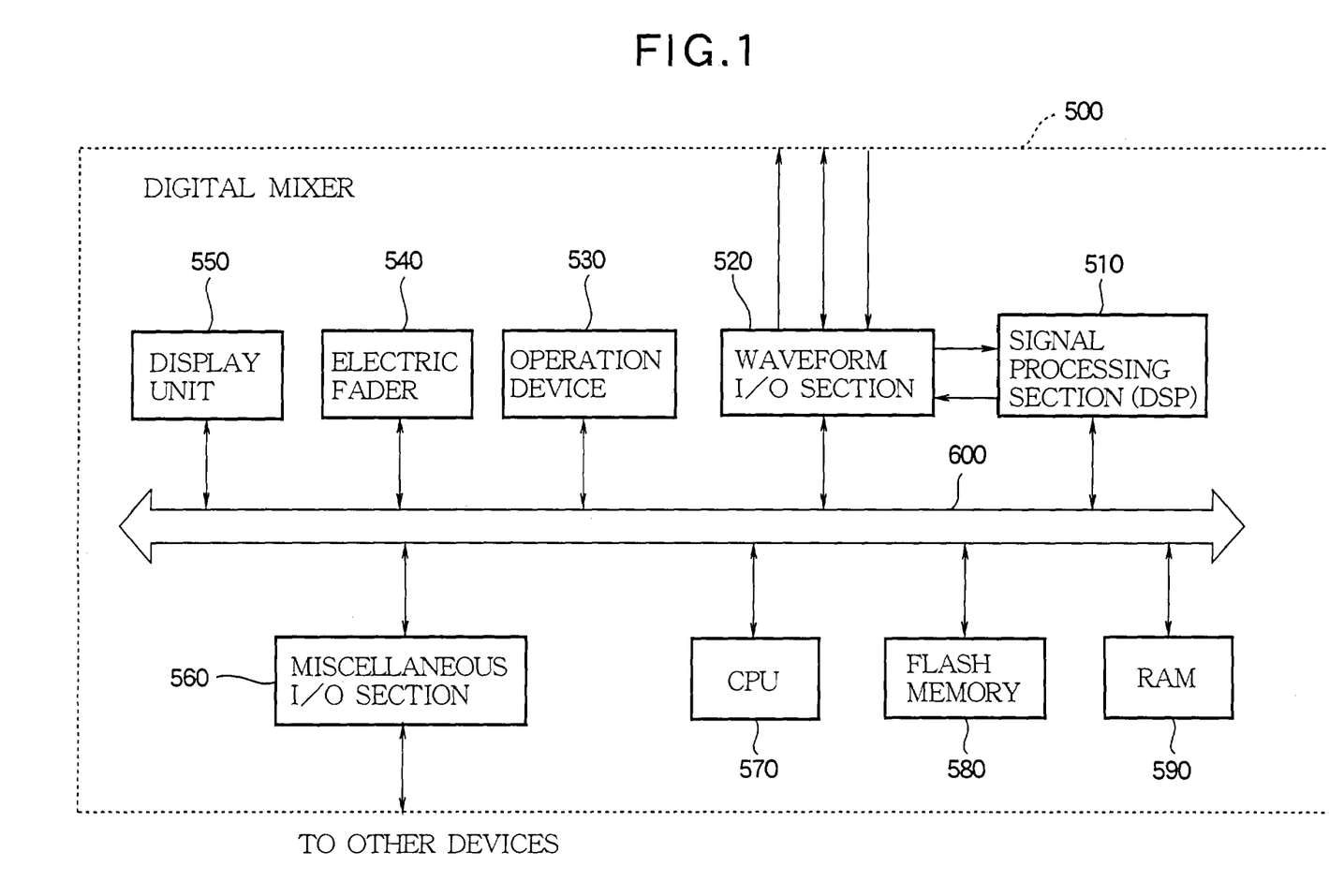
FIG. 1 is a configuration diagram of a digital mixer using the level adjustment method as an embodiment of the present invention.

FIG. 1 shows a hardware configuration of the audio processing apparatus (digital mixer) as an embodiment of the present invention.

In FIG. 1, the reference numeral 510 represents a signal processing section comprising a digital signal processor (DSP). The reference numeral 520 represents a waveform I/O section comprising an A/D converter and a D/A converter. Therefore, it is possible to provide not only digital input/output, but also analog input/output to/from external apparatuses.

The reference numeral 530 represents an operation device comprising a pointing device, a switch, and the like for selecting various input/output devices and setting various parameters. The reference numeral 540 denotes an electric fader that functions as an attenuator. When an operator or user operates the electric fader 540, the operated position is set as a parameter. The electric fader 540 is driven electrically and automatically determines the fader position in accordance with the parameter information. One electric fader may be assigned to a plurality of input channels that are simultaneously attenuated for the same amount. The reference numeral 550 represents a display unit that displays various information such as effects, parameters, and the like to the operator. The display unit 550 uses a setup screen in cooperation with the pointing device as a graphic user interface (GUI) to configure various parameters.

The reference numeral 560 represents a miscellaneous I/O section that comprises a USB port, a MIDI interface, and the like and is connected to other audio processing apparatuses. The reference numeral 570 represents a CPU that controls the other parts such as the signal processing section 510. The reference numeral 580 represents a flash memory that is ROM capable of electrical writing and erasure. The flash memory 580 stores programs, parameters, and the like for controlling the CPU 570. The reference numeral 590 represents RAM used as a work memory for the CPU 570.

(2) Connection Example

Figure 2:
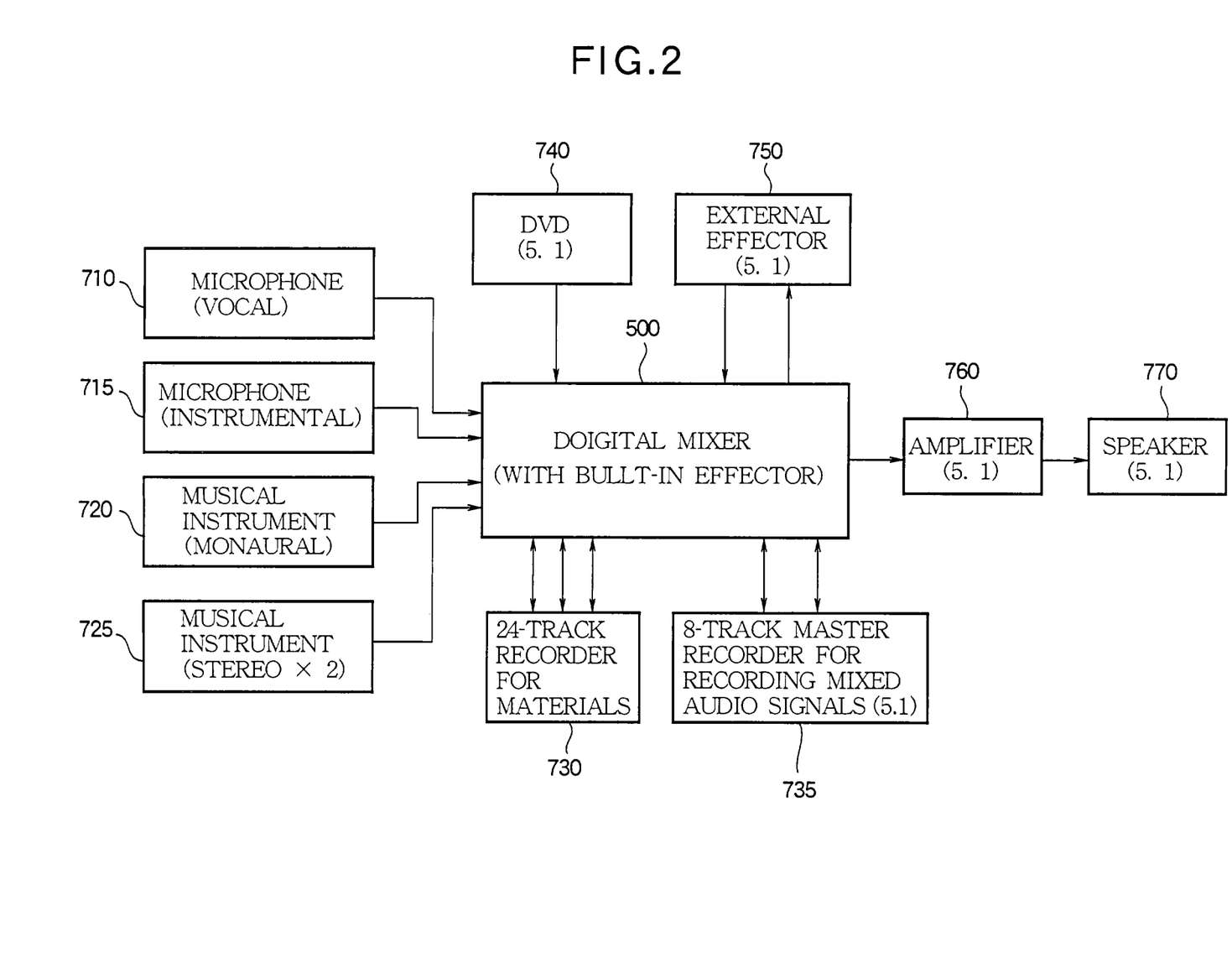
FIG. 2 is a connection diagram of a waveform I/O section of the digital mixer.

The waveform I/O section 520 is connected to an external input/output apparatuses for input or output of analog or digital audio signals. With reference to FIG. 2, an example of connection therebetween will now be described.

In FIG. 2, the reference numerals 710 and 715 denote microphones for collecting vocal and instrumental sounds, respectively. The reference numerals 720 and 725 denote monaural and stereo musical instruments, respectively, to supply generated audio signals in an analog form. These musical instruments may comprise electronic musical instruments. The reference numeral 760 denotes an amplifier that generates the mixed audio signal via a speaker 770. The speaker and the amplifier are configured to be a 5.1 channel sound system.

Here, the 5.1 channel sound system comprises speaker systems of left channel (L), right channel (R), left surround (LS), right surround (RS), center channel (C), and low frequency effect (LFE). The 5.1 channel sound system may be provided with a rear center speaker to form an extended 6.1 channel sound system.

The reference numeral 730 represents a 24-track recorder to record musical sounds for materials. The reference numeral 735 represents an 8-track master recorder to record mixed audio signals. The reference numeral 740 represents a DVD to generate 5.1 channel compliant audio signals. The reference numeral 750 represents an external effector to add various effects to input signals. The multi-channel system is capable of treating analog and digital input/output.

Figure 3:
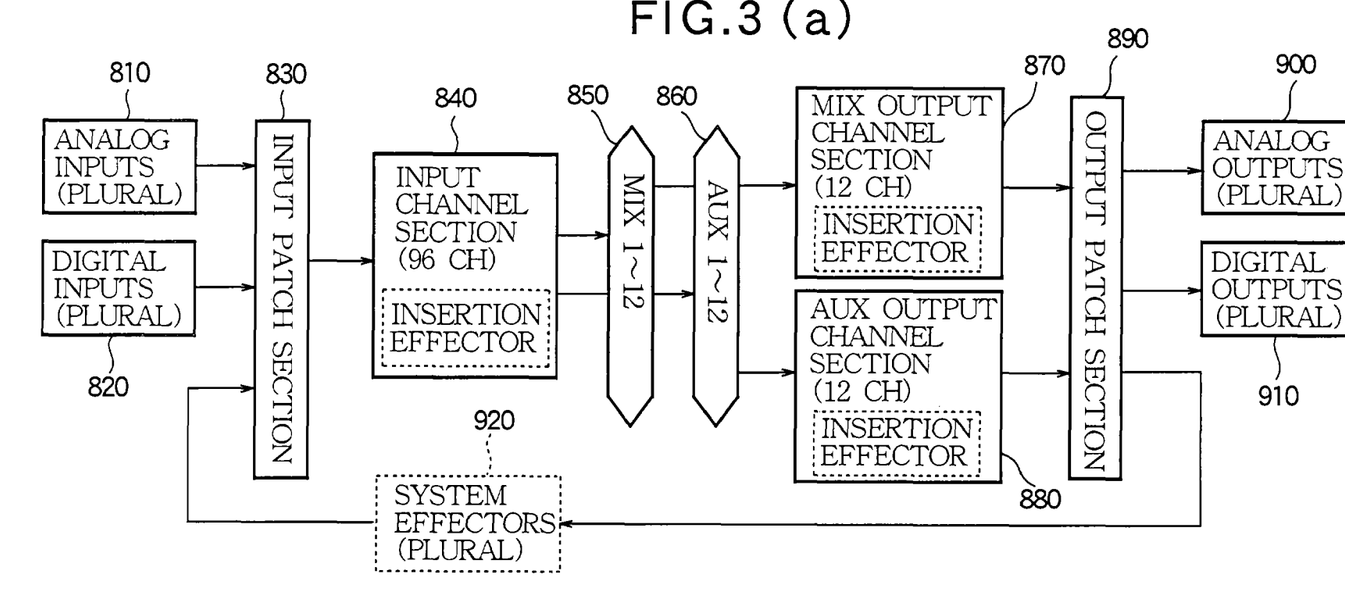

2. Algorithm Configuration According to the Embodiment (1) Overall Configuration With reference to FIGS. 3(*a*) and 3(B), the following describes the overall configuration of an algorithm implemented as software in the signal processing section 510, the CPU 570, and the like.

In FIG. 3(*a*), the reference numeral 810 represents analog inputs including analog signals supplied from the microphones 710 and 715, the musical instruments 720 and 725, and the like. The reference numeral 820 denotes digital inputs including digital signals supplied from the DVD 740, the external effector 750, and the like and complies with the 5.1 channel system. The waveform I/O section 520 implements these input functions as hardware. The operation device 530 is used to select input/output apparatuses.

When the signal processing section 510 and the waveform I/O section 520 handle 5.1 channel signals, six channels are assigned to audio signals in correspondence with six speakers (L, R, LS, RS, C, and LFE). In the following description, these six channels are collectively referred to as a "multichannel".

The reference numeral 830 represents an input patch section that receives signals from the analog input section 810 and the digital input section 820 in accordance with specifications of the operation device 530 etc., and allocates these signals to any channels in an input channel section 840. The input channel section 840 comprises 96 input channels, each of which is assigned with the gate, equalizer, delay, and fader functions by default. When a 5.1 channel signal is to be input, any six of the 96 input channels are allocated for processing the six components (L, R, LS, RS, C, and LFE) of the 5.1 channel signal to be input.

The following describes the configuration corresponding to each channel in the input channel section 840.

In FIG. 3(b), the reference numeral 831 denotes a noise gate section that attenuates an output level when the signal level falls short of a specified value. The reference numeral 832 denotes an equalizer section that adjusts frequency characteristics of an input signal based on operations of the operation device 530 and the like. The reference numeral 833 denotes a delay section that delays an input signal for a specified time. The reference numeral 834 denotes a fader section that adjusts a sound volume in accordance with a value of the electric fader 540.

An output signal from the input channel is selectively output to any of 12 MIX buses and 12 AUX buses. Each MIX bus mixes an input signal. The mixed signal is supplied to a corresponding MIX output channel in an MIX output channel section 870. An output from the MIX output channel section 870 is used for an auditorium, for example. An AUX output channel section 880 provides 12 channels for the 12 MIX buses 850 and 12 channels for the 12 AUX buses 860. When the MIX buses are used for 5.1 channel mixing, any six of the 12 MIX buses are assigned for mixing the six system components (L, R, LS, RS, C, and LFE) of the 5.1 channel system. The six MIX output channels corresponding to the six buses process the mixed 5.1 channel signal. Like the MIX buses, the AUX buses can be used for the 5.1 channel mixing.

Further, the algorithm provides a plurality of effect resources that can be used as system effects or insertion effects. Just one effect resource can be used to implement an ordinary effect. A plurality of effect resources can be used to provide a complicated effect. Using one effect resource, it is possible to insert various effects, i.e., insertion effects, such as a compressor into the input channel, the MIX output channel, and the AUX output channel. The input channel section 840 can be selectively inserted with effect modules between the default functions such as the gate section 831 and the fader section 834 (FIG. 3(b)).

Figure 4:
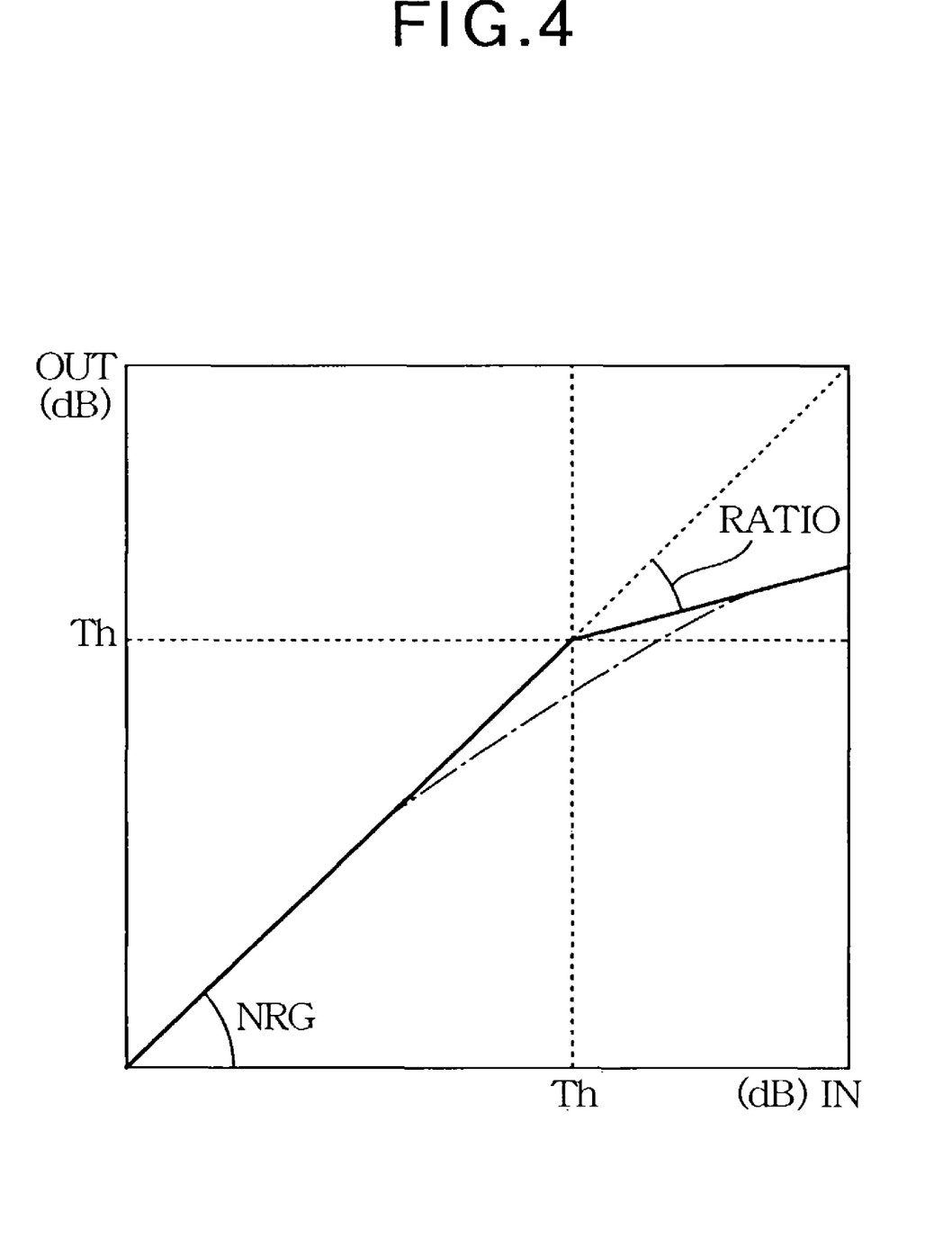
FIG. 4 shows input/output characteristics of a compressor unit.

As indicated with a solid line in FIG. 4, the compressor is an effect configured as follows. When an input signal exceeds a threshold Th, the compressor attenuates the level for an excess portion, thus compresses a dynamic range, and ensures the mixing operation in a smooth and wide range of levels. In FIG. 4, the abscissa represents an input level and the ordinate represents an output level. Both are indicated in logarithms (decibels). NRG signifies a normal gain indicating a ratio between output and input levels without attenuation. RATIO indicates an attenuation ratio found by subtracting a ratio between attenuated output and input levels from the normal gain value. A dash-dot line in FIG. 4 shows a curve changed from a steep gain change near the threshold Th into a smooth characteristic. A "KNEE" parameter specifies a ratio of changes.

Now back to FIG. 3(a), the reference numeral 890 represents an output patch section that allocates signals from the MIX output channel section 870 and the AUX output channel section 880 to any analog outputs 900 and digital outputs 910.

It is possible to insert a plurality of system effects 920 between the output patch section 890 and the input patch section 830 by using the effect resources. For example, the following describes how to provide the system effect for stereo input and stereo output. Two MIX buses are used for stereo mixing. At the same time, two AUX buses are used for stereo mixing of a signal to be supplied to the system effect. A stereo signal output from the system effect is input to the two MIX buses that mix a plurality of input channels. It is possible to apply the system effect to signals for these channels with different effect depths. In this case, the system effect 920 provides an effect that may or may not differ from an effect provided by the insertion effect.

(2) Algorithm Configuration of a Compressor 5.1

Figure 5:
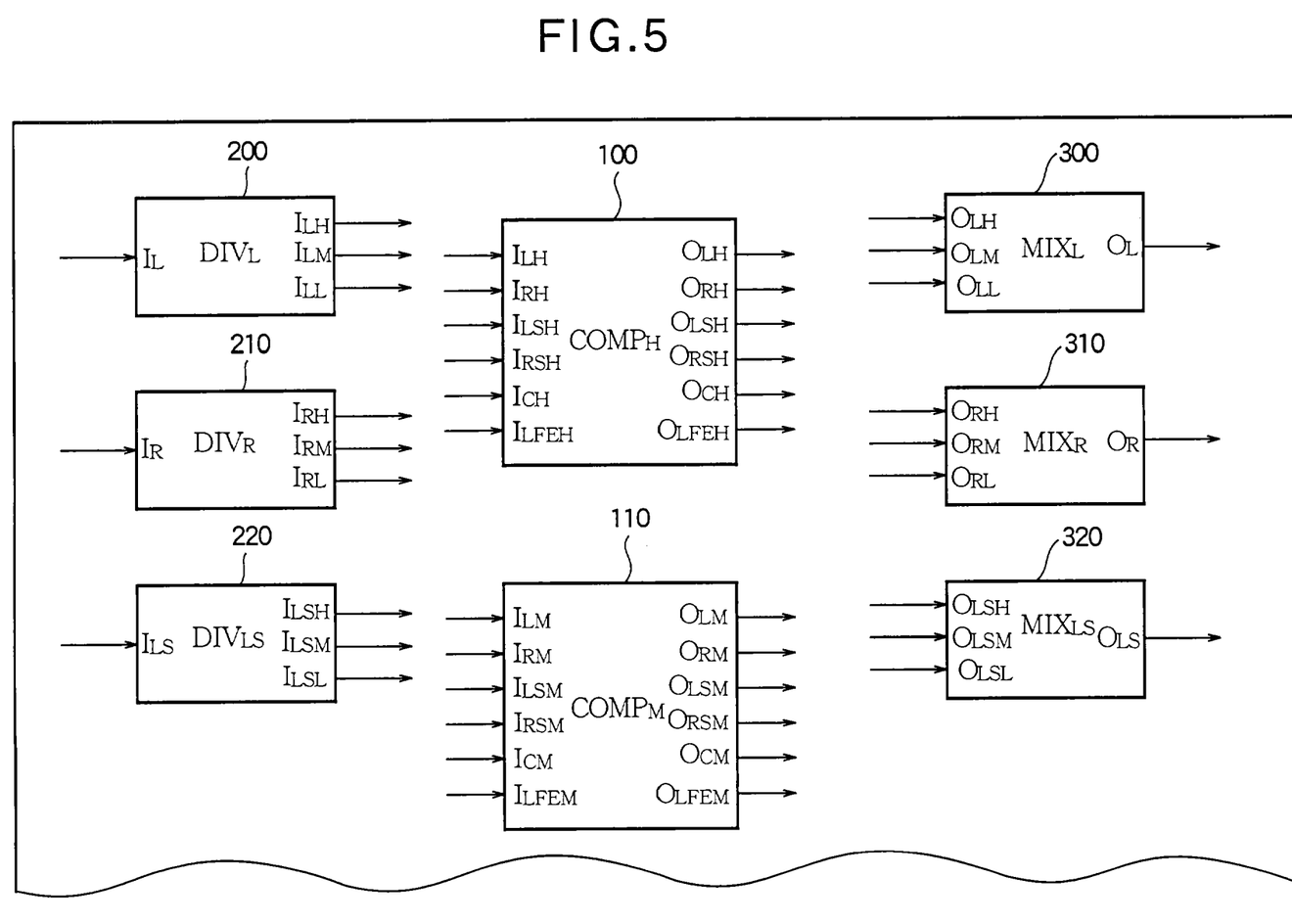
FIG. 5 is a fragmentary configuration diagram showing an algorithm of a compressor 5.1.
Figure 6:
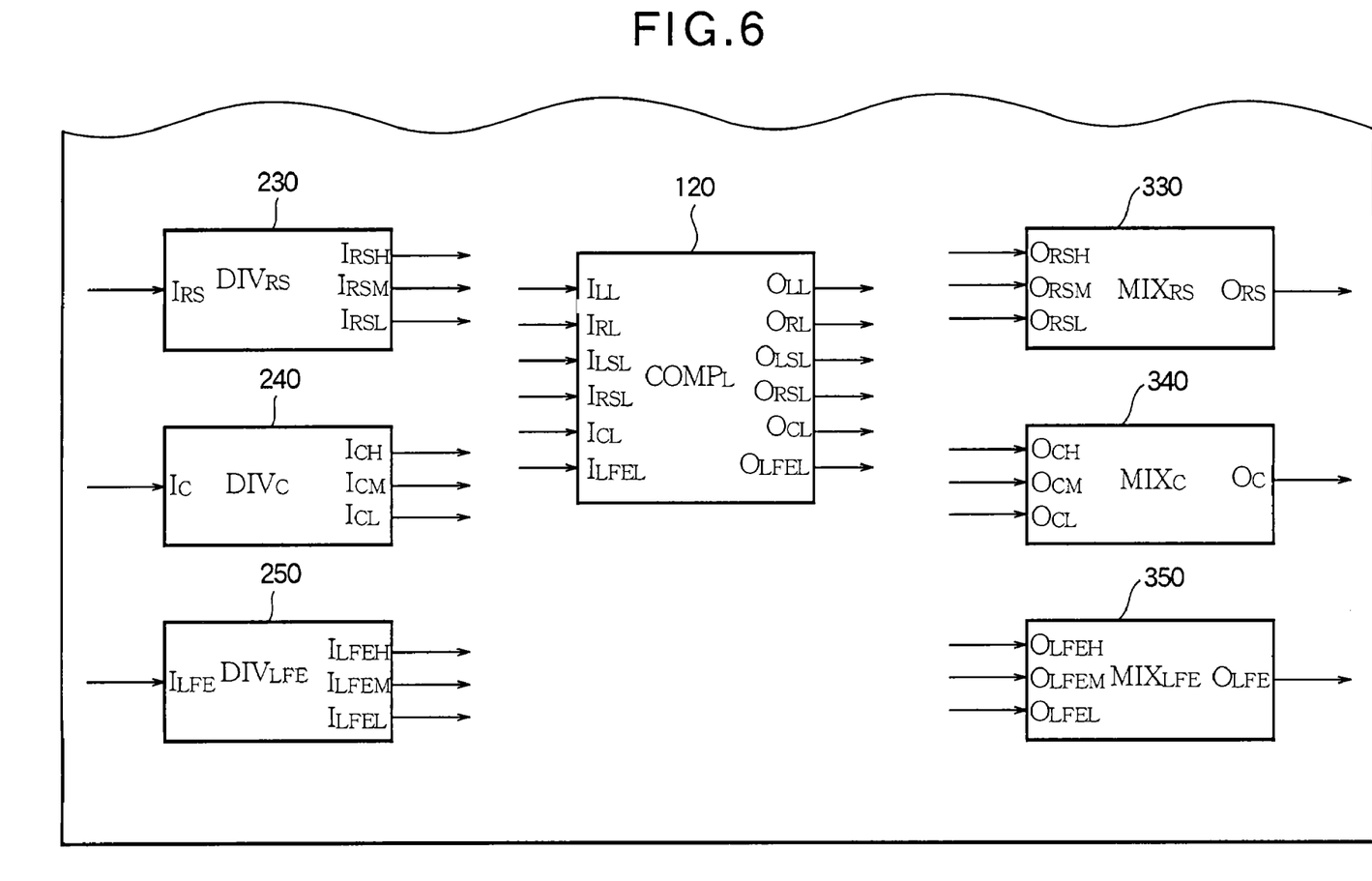
FIG. 6 is a fragmentary configuration diagram showing an algorithm of the compressor 5.1.

The audio processing apparatus can be supplied with such effects as: the reverb effect that generates an echo; the chorus effect that changes a sound from a single sound source as if sounds were simultaneously generated from a plurality of sound sources; and the tremolo effect that finely and regularly repeats a single sound or a plurality of sounds. With reference to FIGS. 5 and 6, the following describes an algorithm configuration of the compressor 5.1, namely, one of effects that use a plurality of effect resources for implementation. This compression effect is used for input and output of 5.1 channel signals. After selecting the effect as one of effects that use the effect resources, a user specifies whether the effect should be used as an insertion effect to be inserted into the input channel section 840, the MIX output channel section 870, and the AUX output channel section 880 or as the system effect 920. When the effect is to be used as the insertion effect, the user further specifies a stage of six channels in these channel sections where the effect should be inserted. Normally, the insertion effect is inserted into six input channels assigned with 5.1 channel signals in the input channel section 840. The insertion effect may be inserted into six MIX output channels corresponding to six MIX buses for 5.1 channel mixing in the MIX output channel section 870. When the effect is to be used as the system effect, the user specifies which of the MIX output channel section and the AUX output channel section should be used to supply six channels to the output patch section 890. The user then specifies the input patch section 830 so that it can generate an output to particular six channels in the input channel section 840. Normally, this system effect is supplied with six signals output from output channels corresponding to the six buses for 5.1 channel mixing.

The reference numeral 200 represents a band split filter for the left channel that has a function of splitting or dividing an input signal $I_L$ of the left channel into a high-band signal $I_{LH}$, a medium-band signal $I_{LM}$, and a low-band signal $I_{LL}$. Likewise, the reference numeral 210 represents a band split filter for the right channel, 220 that for the left surround, 230 that for the right surround, 240 that for the center channel, and 250 that for the low band. When each channel signal is split into high, medium, and low bands and then is compressed, it is possible to prevent the signals for all bands as a whole from being attenuated due to a signal belonging to the band emphasized by the equalizer, for example.

The reference numeral 100 denotes a high-band compressor unit that processes the high-band signals $I_{LH}$, $I_{RH}$, $I_{LSH}$, $I_{RSH}$, $I_{CH}$, and $I_{LFEH}$ separated by the band split filter, attenuates the levels of these signals, and generates output signals $O_{LH}$, $O_{RH}$, $O_{LSH}$, $O_{RSH}$, $O_{CH}$, and $O_{LFEH}$. The details will be described later. Likewise, the reference numeral 110 denotes a medium-band compressor unit that processes the medium-band signals $I_{LM}$, $I_{RM}$, $I_{LSM}$, $I_{RSM}$, $I_{CM}$, and $I_{LFEM}$, attenuates the levels of these signals, and generates output signals $O_{LM}$, $O_{RM}$, $O_{LSM}$, $O_{RSM}$, $O_{CM}$, and $O_{LFEM}$. The reference numeral 120 denotes a low-band compressor unit that processes the low-band signals $I_{LL}$, $I_{RL}$, $I_{LSL}$, $I_{RSL}$, $I_{CL}$, and $I_{LFEL}$, attenuates the levels of these signals, and generates output signals $O_{LL}$, $O_{RL}$, $O_{LSL}$, $O_{RSL}$, $O_{CL}$, and $O_{LFEL}$.

The reference numeral 300 represents a left-channel mixer unit that mixes the left-channel signals $O_{LH}$, $O_{LM}$, and $O_{LL}$ of the respective bands fed from the high-band compressor unit 100, the medium-band compressor unit 110, and the low-band compressor unit 120, and generates an output signal $O_L$. Likewise, the reference numeral 310 represents a right-channel mixer unit that mixes the right-channel signals $O_{RH}$, $O_{RM}$, and $O_{RL}$ for the corresponding bands and generates an output signal $O_R$. The reference numeral 320 represents a left-surround mixer unit that mixes the left-surround signals $O_{LSH}$, $O_{LSM}$, and $O_{LSL}$ for the corresponding bands and generates an output signal $O_{RS}$. The reference numeral 330 represents a right-surround mixer unit that mixes the right-surround signals $O_{RSH}$, $O_{RSM}$, and $O_{RSL}$ for the corresponding bands and generates an output signal $O_{RS}$. The reference numeral 340 represents a center-channel mixer unit that mixes the center-channel signals $O_{CH}$, $O_{CM}$, and $O_{CL}$ for the corresponding bands and generates an output signal $O_C$. The reference numeral 350 represents a low-band channel mixer unit that mixes the LFE channel signals $O_{LFEH}$, $O_{LFEM}$, and $O_{LFEL}$ for the corresponding bands and generates an output signal $O_{LFE}$.

(3) Algorithm Configuration of the Compressor

Figure 7:
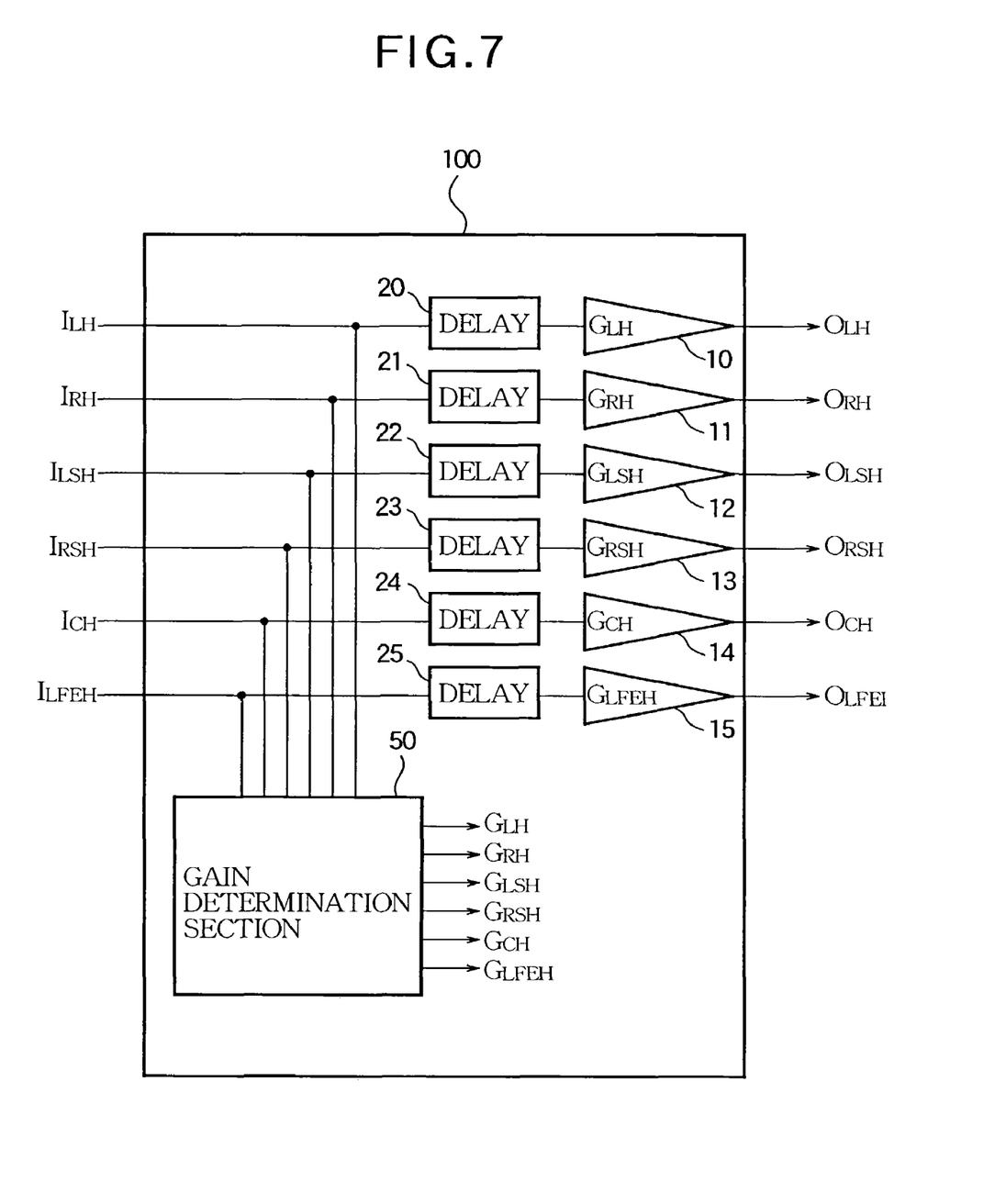
FIG. 7 is a configuration diagram showing an algorithm of the compressor unit.

Referring now to FIG. 7, the following describes the algorithm configuration of the compressor units used for the compressor 5.1 using the high-band compressor unit 100 as a representative example.

In FIG. 7, the reference numerals 20, 21, 22, 23, 24, and 25 represent delay units that delay the corresponding input signals for specified times. The reference numerals 10, 11, 12, 13, 14, and 15 represent multipliers. A signal from each of channels constituting the multi-channel is multiplied (amplified) by a multiplier signal representing an amplification rate (to be described). Each multiplier outputs the multiplied signal. The delay units and the multipliers are provided for the input signals $I_{LH}$, $I_{RH}$, $I_{LSH}$, $I_{RSH}$, $I_{CH}$, and $I_{LFEH}$ and for the output signals $O_{LH}$, $O_{RH}$, $O_{LSH}$, $O_{RSH}$, $O_{CH}$, $O_{LFEH}$. The reference numeral 50 represents a gain determination section that determines multiplier signals to be supplied to the multipliers 10, 11, 12, 13, 14, and 15.

Referring now to FIGS. 8(a) through 8(d), the following describes an algorithm configuration of the gain determination section.

The gain determination section groups a plurality of signals from the multi-channel into one or more of groups and determines a multiplier signal to be input to each multiplier. Here, a KEY_LINK parameter is specified to select one or more of four grouping types as follows. Accordingly, the gain determination section is also available in four types of configurations in accordance with grouping types of KEY_LINK.

The "KEY_LINK1" selects all 5.1 channel signals (L+R+LS+RS+C+LFE) as one group. "KEY_LINK2" selects five signals (L+R+LS+RS+C) associated with the localization as one group. The low-band component LFE is separated. This parameter is used to prevent volumes of the five signals from being compressed due to compression of the low-band component. "KEY_LINK3" groups not only the low-band component LFE, but also three forward signals (L+R+C) and two backward signals (LS+RS). When there are only reverberation components backward, for example, it is possible to make the forward signals and the backward signals independent from each other to prevent an effect of the reverberation components. "KEY_LINK4" further groups two forward channels (L+R) and two backward channels (LS+RS) and isolates the forward center channel (C). In the movies, for example, lines spoken by an actor or an actress are usually inserted into the center channel. This parameter is used to prevent the gain of the lines from being affected by the music, etc.

FIG. 8(a) shows a configuration of a gain determination section 50a for "KEY_LINK1" that selects all the six signals of the multi-channel as one group.

In FIG. 8(a), the reference numeral 60 denotes an absolute value and maximum value detection unit that holds a maximum value of absolute values of the input signals $L_H$, $I_{RH}$, $I_{LSH}$, $I_{RSH}$, $I_{CH}$, and $I_{LFEH}$ within a specified time period. This held value becomes the maximum value of respective signal levels (envelopes) for the six signals. The reference numeral 70 denotes a gain control unit that determines a multiplier gain, i.e., a multiplier signal using the above-mentioned maximum value as an input level according to a characteristic curve similar to that of FIG. 4. The reference numeral 80 denotes an attack release control unit that controls a rise and a fall of the multiplier signal based on a time constant determined by the operation device 530 and generates multiplier signals $G_{LH}$, $G_{RH}$, $G_{LSH}$, $G_{RSH}$, $G_{CH}$, and $G_{LFEH}$ (all six signals assigned the same value) in the multipliers 10, 11, 12, 13, 14, and 15. The above-mentioned delay units 20 through 25 use a constant value as the delay time that is equivalent to a delay time required for detection of the maximum signal level as mentioned above.

As described above, the group control process comprises a detection process of detecting the maximal one of the signal levels of the input channels belonging to the same group, and an adjustment process of adjusting the amplification rate of all the amplifiers involved in the same group according to the detected maximal signal level such as to decrease the amplification rate as the maximal signal level increases. In such a case, the group control process further comprises a sample and hold process of successively sampling absolute values of the signal level of each input channel for a predetermined period and holding a greatest one of the sampled absolute values, so that the sampled and held greatest absolute value represents the signal level of the input channel. Further, the detection process detects a maximal one of the respective greatest absolute values sampled and held for the respective input channels of the same group, thereby determining the maximal signal level.

FIG. 8(b) shows a configuration of a gain determination section 50b for "KEY_LINK2". In this case, the gain determination section comprises a gain determination section 51 to select five signals $I_{LH}$, $I_{RH}$, $I_{LSH}$, $I_{RSH}$, and $I_{CH}$ and a gain determination section 52 to select the $I_{LFEH}$ signal. The gain determination section 51 detects the maximum signal level value from these five signals, determines a common multiplier signal according to this maximum value, and assigns appropriate values to the multiplier signals $G_{LH}$, $G_{RH}$, $G_{LSH}$, $G_{RSH}$, and $G_{CH}$. The gain determination section 52 detects the maximum signal level value for the low-band signal $I_{LFEH}$ to determine the multiplier signal $G_{LFEH}$.

FIG. 8(c) shows a configuration of a gain determination section 50c for "KEY_LINK3". In this case, the gain determination section 50c comprises a gain determination section 53 to select three signals $I_{LH}$, $I_{RH}$, and $I_{CH}$, a gain determination section 54 to select signals $I_{LSH}$ and $I_{RSH}$, and a gain determination section 55 to select the signal $I_{LFEH}$. The gain determination section 53 detects the maximum signal level value from the three signals $I_{LH}$, $I_{RH}$, and $I_{CH}$, determines a common multiplier signal according to this detected value, and assigns appropriate values to the multiplier signals $G_{LH}$, $G_{RH}$, and $G_{CH}$. The input signals $I_{LSH}$ and $I_{RSH}$ determine a common signal for the multiplier signals $G_{LSH}$ and $G_{RSH}$. The input signal $I_{LFEH}$ determines a value for the multiplier signal $G_{LFEH}$.

Figure 8:
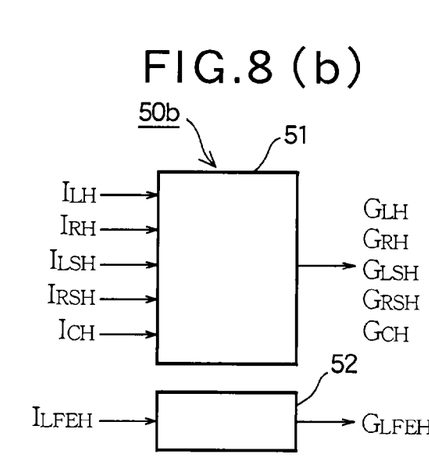

FIG. 8(*d*) shows a configuration of a gain determination section 50*d* for "KEY_LINK4". In this case, the gain determination section 50*d* comprises a gain determination section 56 to select the two signals $I_{LH}$ and $I_{RH}$, a gain determination section 57 to select the signal $I_{CH}$, a gain determination section 58 to select the signals $I_{LSH}$ and $I_{RSH}$, and a gain determination section 59 to select the signal $I_{LFEH}$. The gain determination section 56 detects the maximum signal level value from the two signals $I_{LH}$ and $I_{RH}$, determines a common multiplier signal according to this detected value, and assigns appropriate values to the multiplier signals $G_{LH}$ and $G_{RH}$. The other signals $I_{LSH}$ and $I_{RSH}$ determine a common value for the multiplier signals $G_{LSH}$ and $G_{RSH}$. The signal $I_{CH}$ determines a value for the multiplier signal $G_{CH}$. The signal $I_{LFEH}$ determines a value for the multiplier signal $G_{LFEH}$.

3. Operations of the Embodiment (1) Parameter Settings

Figure 9:
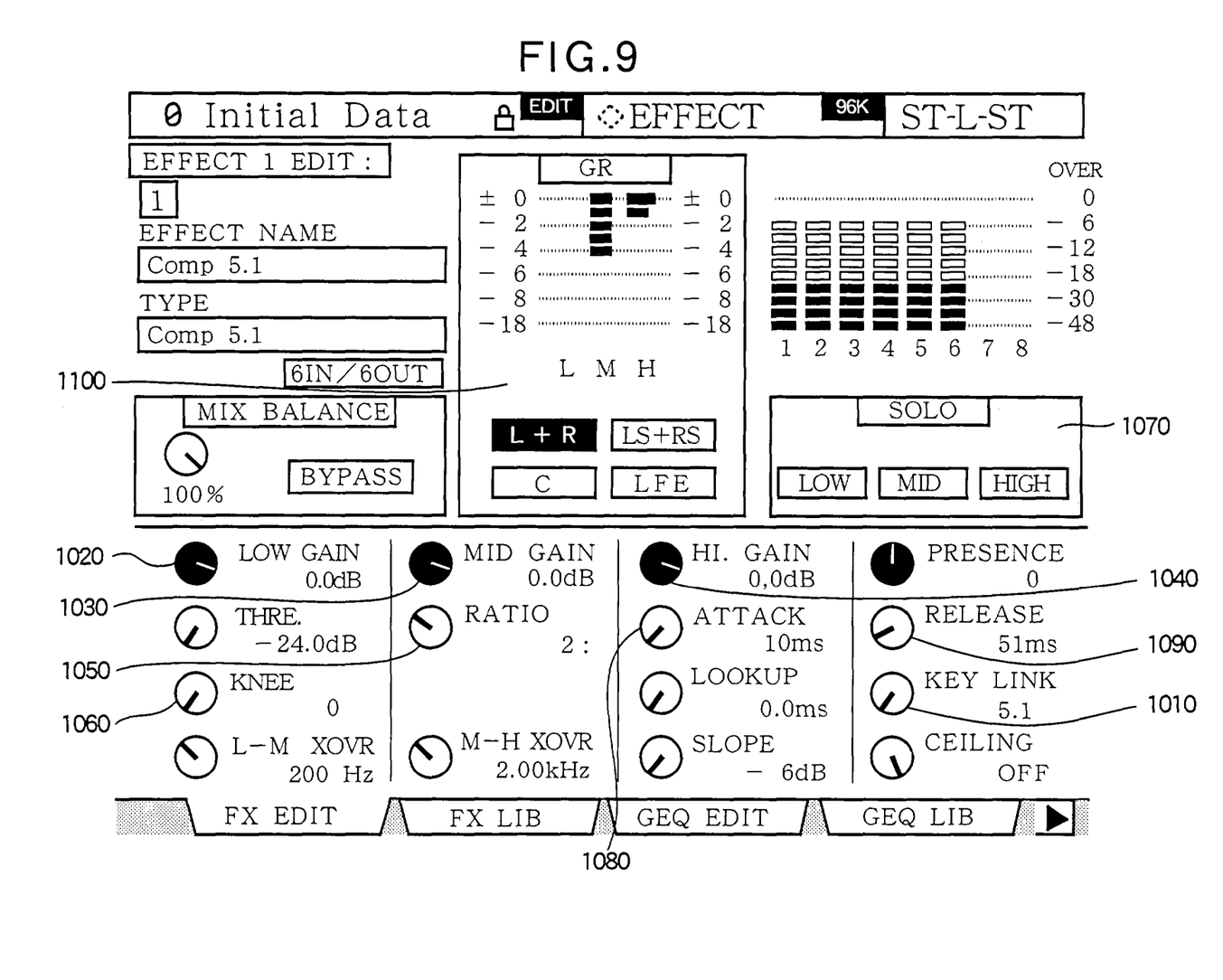
FIG. 9 shows a setup screen on a display.

When a user performs specified operations to select the effect "compressor 5.1" and instructs the edition of the effect, a display 550 presents a screen as shown in FIG. 9. On this GUI screen, the user can use a pointing device to move a cursor to objects or icons to be operated and "click" on display buttons to select operations or set parameters. The reference numerals 1020, 1030, and 1040 represent virtual volume operation devices that can be set in 0.1 dB increments.

The reference numeral 1010 represents a KEY_LINK key that selects one of "KEY_LINK1" to "KEY_LINK4" according to the KEY_LINK parameter. On the display screen, selecting "KEY_LINK1" displays "5.1". Selecting "KEY_LINK2" displays "5.0". Selecting "KEY_LINK3" displays "3+2". Selecting "KEY_LINK4" displays "2+2". The compressor selects an input signal for determining a multiplier signal from the multi-channel. The reference numeral 1110 represents an attenuation ratio meter, in which an attenuation ratio (=gain=multiplier signal) is indicated for respective frequency bands of a group consisting of one or two channel selected from L+R, LS+RS, C and LFE. In the attenuation ratio meter shown in FIG. 9, there is indicated an attenuation ratio for the group of L and R channels in each of the frequency bands. Further, in the example shown in FIG. 9, KEY_LINK1 is selected by the KEY_LINK key 1010. As described before, in the KEY_LINK1, the multiplier signals $G_{LH}$, $G_{RH}$, $G_{LSH}$, $G_{RSH}$, $G_{CH}$ and $G_{LFEH}$ are set to the identical value for all the channels, hence the attenuation ratios are identical for the respective frequency bands indicated by the attenuation ratio meter 1110.

The reference numeral 1020 denotes a LOW_GAIN key, 1030 a MID_GAIN key, and 1040 a HI_GAIN key that specify level values for the low-band, medium-band, and high-band components, respectively. The reference numeral 1050 denotes a RATIO key that specifies an attenuation ratio within the range from 1:1 to 20:1 when an input level exceeds the threshold Th of the compressor. The reference numeral 1060 denotes a KNEE key that relieves a steep gain change near the compressor threshold Th into a gentle or smooth characteristic. The relieving level varies at six grades. The reference numeral 1070 denotes a SOLO key that mutes all sounds except those for the low, medium, or low band enabled. Since only one band becomes audible, it is possible to adjust parameters for the corresponding band without an effect of signals from the other bands. The reference numeral 1080 denotes an ATTACK time key that specifies a value within the range from 0 to 120 msec. The reference numeral 1090 denotes a RELEASE time key that specifies the release time RELEASE.

(2) Audio Signal Synthesis

First, the operation device 530 and the like are used to specify parameters such as the key link KEY_LINK, the threshold Th, the RATIO, the level values LOW_GAIN, MID_GAIN, and HI_GAIN for the corresponding frequency bands, the attack time ATTACK, and the release time RELEASE. When the signals are input, gains for respective frequency bands are determined by the gain determination sections 50, 51, and so on corresponding to the input channels selected by the key link. When KEY_LINK1 is selected for high-frequency components, for example, the absolute value and maximum value detection unit 60 peak-holds the maximum value of the input signals within a specified time period. The peak-held value is the maximum value of signal levels (envelopes) of the six input signals. If the peak-held value is smaller than the threshold value Th defined by the operation device 530, the gain control unit 70 assigns the level value HI_GAIN unchanged as the normal gain NRG as shown in FIG. 4 to the multiplier signal applied to the multipliers 10, 11, 12, 13, 14, and 15. If the peak-held value exceeds the threshold value Th, the normal gain NRG is corrected or adjusted so that the excess level is suppressed in accordance with the RATIO as shown in FIG. 4. The corrected value is assigned to the multiplier signal. The similar process is executed for the low-frequency and medium-frequency components. Specifying the "KNEE" parameter provides a value for the multiplier signal corresponding to the smoothed gain characteristic. That is to say, when the peak-held value is near the threshold Th, the multiplier signal is assigned a value with the smoothed gain characteristic.

At this time, a time difference occurs until detection of the maximum value for the input signals. Accordingly, the delay units 20, 21, 22, 23, 24, and 25 delay the time until the input signal is supplied to the multipliers 10, 11, 12, 13, 14, and 15. On the other hand, the attack release control unit 80 adjusts a rise and a fall of the maximum value for the detected input signal. After the input signal level exceeds the threshold value Th, the attack time ATTACK determines a response until the beginning of compression and is set to the range from several tens of microseconds to approximately 100 milliseconds. After the input signal level goes below the threshold Th, the release time RELEASE determines the time to release the compression and resume the normal gain, and is set to the range from several milliseconds to approximately several seconds.

As described above, a graphic user interface is installed in an audio processing apparatus having a plurality of amplifiers corresponding to three or more of input channels of an audio signal for amplifying signal levels of the respective input channels. The graphic user interface is designed for assisting the audio processing apparatus in performing a level adjustment method comprising a group arrangement process of arranging the plurality of the input channels into one or more group, and a group control process of controlling each group such as to decrease an amplification rate of all the amplifiers corresponding to the input channels belonging to the same group as a maximal one of the signal levels of the input channels belonging to the same group increases. The graphic user interface provides a visual symbol prompting the user to select desired grouping of the input channels at the group arrangement process, and another visual symbol prompting the user to input parameters effective to determine how the amplification rate is decreased according to the maximal signal level during the group control process. Typically, the parameters include a threshold parameter and a knee parameter, such that the group control process decreases the amplification rate when the maximal signal level exceeds a threshold level determined by the threshold parameter, and smoothens a transition of the amplification rate around the threshold level according to the knee parameter.

3. Modifications

The present invention is not limited to the above-mentioned embodiment and may be embodied in various modifications as follows which are all included in the category of the present invention.

(1) While the embodiment is configured to select one of four grouping types of key links, it is possible to set any combination of six types of multi-channel signals.

(2) While the embodiment detects the maximum value from absolute values of the input signals to find the multiplier signal, the present invention is not limited thereto. It may be preferable to find the multiplier signal (amplification) using a value found by integrating absolute values of the input signals or using a square integration value of the input signals.

(3) The embodiment uses the program stored in the flash memory 580 to implement the function of compressing audio signals. For example, it is also possible to implement the same function using an application program running on an personal computer. It may be preferable to distribute only the application program by recording it on storage media such as CD-ROM and floppy disks or by delivering it via transmission paths.

As mentioned above, the present invention can appropriately group multi-channel signals to adjust signal levels.

What is claimed is:

1. A level adjustment method executed in applicable to an audio processing apparatus having a plurality of amplifiers corresponding to three or more of channels of audio signals, for inputting the audio signals and amplifying the input audio signals, the level adjustment method comprising:

a group type select process of selecting a grouping type among a plurality of grouping types, according to operation by a user;

a group arrangement process of arranging the plurality of the channels into one or more groups according to the selected grouping type, such that the groupings of the channels are different as between any given two of the grouping types;

a detection process of detecting, for each group, a maximal value of the signal levels of the input audio signals of channels belonging to the group; and an adjustment process of determining, for each group, a common amplification gain according to the detected maximum value and supplying the determined common amplification gain to the amplifiers of the channels belonging to the group such as to attenuate the output levels of the input audio signals if the maximum value exceeds a threshold level specified by the user wherein said three or more channels of audio signals constitute a set of surround signals in an ordinary surround system and are grouped together into one or more groups during said group arrangement process, wherein each of the channels of audio signals belongs to only one of the groups and wherein, when the maximum signal level is below the threshold level, the adjustment process is performed to maintain the common amplification gain, when the maximum signal level exceeds the threshold level, the adjustment process is performed to attenuate the level of the input audio signals.

2. The level adjustment method according to claim 1, wherein the group arrangement process is applied to audio signals of a surround system having at least six channels including a left channel, a right channel, a left surround channel, a right surround channel, a center channel, and an LFE channel, and wherein the group arrangement process arranges all of the left channel, the right channel, the left surround channel, the right surround channel, the center channel and the LFE channel into one group, according to the selected grouping type.

3. The level adjustment method according to claim 1, wherein the group arrangement process is applied to audio signals of a surround system having at least six channels including a left channel, a right channel, a left surround channel, a right surround channel, a center channel, and an LFE channel, and wherein the group arrangement process arranges the channels into a first group including the left channel, the right channel, the left surround channel, the right surround channel and the center channel, and a second group including the LFE channel, according to the selected grouping type.

4. The level adjustment method according to claim 1, wherein the group arrangement process is applied to audio signals of a surround system having at least six channels including a left channel, a right channel, a left surround channel, a right surround channel, a center channel, and an LFE channel, and wherein the group arrangement process arranges the channels into a first group including the left channel, the right channel and the center channel, a second group including the left surround channel and the right surround channel, and a third group including the LFE channel, according to the selected grouping type.

5. The level adjustment method according to claim 1, wherein the group arrangement process is applied to audio signals of a surround system having at least six channels including a left channel, a right channel, a left surround channel, a right surround channel, a center channel, and an LFE channel, and wherein the group arrangement process arranges the channels into a first group including the left channel and the right channel, a second group including the left surround channel and the right surround channel, a third group including the LFE channel, and a fourth group including the center channel, according to the selected grouping type.

6. The level adjustment method according to claim 1, further comprising a band separation process of separating the respective channels into a plurality of frequency bands, so that the group arrangement process, the detection process and the adjustment process are applied to a respective one of the frequency bands.

7. The level adjustment method according to claim 1 wherein the detection process further comprises a sample and hold process of successively sampling absolute values of the signal level of each channel for a predetermined period and holding a greatest one of the sampled absolute values, so that the sampled and held greatest absolute value represents the signal level of the channel.

8. The level adjustment method according to claim 7, wherein the detection process detects a maximal one of the respective greatest absolute values sampled and held for the respective channels of the same group, thereby determining the maximal signal level.

9. A level adjustment method to executed in an audio processing apparatus having a plurality of amplifiers corresponding to three or more of channels of, audio signals, for inputting the audio signals and amplifying the input audio signals, the level adjustment method comprising:
 a group type select process of selecting a grouping type among a plurality of grouping types, according to operation by a user;
 a group arrangement process of arranging the plurality of the channels into one or more groups according to the selected group type, such that the groupings of the channels are different as between any given two of the grouping types
 a detection process of detecting, for each group, a maximal value of the signal levels of the input audio signals of the channels belonging to the group; and
 an adjustment process of determining, for each group, a common amplification gain according to the detected maximum value and supplying the determined common amplification gain to the amplifiers of the channels belonging to the group so as to attenuate the level of the output audio signals if the maximum value exceeds a threshold levels specified by the user,
 wherein said three or more channels of audio signals constitute a set of surround signals in an ordinary surround system and are grouped together into one or more groups during said group arrangement process, wherein each of the channels of audio signals belongs to only one of the groups;
 wherein, when the maximum signal level is below the threshold level, the adjustment process is performed to maintain the common amplification gain, when the maximum signal level exceeds the threshold level, the adjustment process is performed to attenuate the level of the input audio signals, and
 wherein the common amplification gain is determined such that the excess of the maximum value is suppressed in accordance with a ratio specified by the user.

10. The level adjustment method according to claim 9, wherein the adjustment process smoothens a transition of the amplification gain around the threshold level according to a predetermined knee parameter.

11. The level adjustment method according to claim 9, further comprising a response control process of controlling a response of the adjusting of the amplification gain relative to the detecting of the maximal signal revel according to predetermined attack and release parameters.

12. An audio processing apparatus comprising: a plurality of amplifiers corresponding to three or more of channels of audio signals, for amplifying signal levels of the respective channels;
 a group type select section that, in response to user operation, selects a desired grouping type among a plurality of grouping types;
 a group arrangement section for arranging the plurality of the channels into one or more group according to the selected grouping type, such that the groupings of the channels are different as between any given two of the grouping types;
 a detection section that detects, for each group, a maximal value of the signal levels of the input audio signals of the channels belonging to the group; and
 an adjustment section that determines, for each group, a common amplification gain according to the detected maximum value and supplying the determined common amplification gain to the amplifiers of the channels belonging to the group so as to attenuate the output levels of the input audio signals if the maximum value exceeds a threshold level specified by the user,
 wherein said three or more channels of audio signals constitute a set of surround signals in an ordinary surround system and are grouped together into one or more groups during said group arrangement process, wherein each of the channels of audio signals belongs to only one of the groups; and
 wherein, when the maximum signal level is below the threshold level, the adjustment process is performed to maintain the common amplification gain, when the maximum signal level exceeds the threshold level, the adjustment process is performed to attenuate the level of the input audio signals.

13. A graphic user interface installed in an audio processing apparatus having a plurality of amplifiers corresponding to three or more of channels of input audio signals, for amplifying the input audio signals, the graphic user interface being designed for assisting the audio processing apparatus in performing a level adjustment method comprising a group arrangement process of arranging the plurality of the channels into one or more group, and a group control process of controlling each group such as to attenuate the output levels of the input audio signals belonging to the same group as a maximal value of the signal levels of the input audio signals belonging to the group increases, wherein the graphic user interface provides:
 a visual symbol prompting the user to select a desired grouping type among a plurality of grouping types, the grouping of the channels at the group arrangement process is controlled according to the selected grouping type, such that the groupings of the channels are different as between any given two of the grouping types; and
 another visual symbol prompting the user to input parameters, including a threshold level, effective to determine how the output audio signals is attenuated according to the maximal signal level during the group control process wherein said three or more channels of audio signals constitute a set of surround signals in an ordinary surround system,
 wherein, the group arranged by the group arrangement process are different between any two of the grouping types and each of the channels of audio signals belong to only of the groups, wherein each of the channels of audio signals belongs to only one of the groups, and wherein, when the maximum signal level is below the threshold level, the group control process is performed to maintain the common amplification gain, when the maximum signal level exceeds the threshold level, the adjustment process is performed to attenuate the level of the input audio signals.

14. The graphic user interface according to claim 13, wherein the parameters further include a knee parameter, such that the group control process attenuate the output levels of the input audio signals when the maximal signal level exceeds a threshold level, and smoothens a transition of the amplification gain around the threshold level according to the knee parameter.

15. An audio processing apparatus comprising: a plurality of amplifiers corresponding to three or more of channels of input audio signals: for amplifying the input audio signals;
- a group type select section of selecting a grouping type among a plurality of grouping types, according to operation by a user
- a group arrangement section that arranges the plurality of the channels into two or more groups according to the selected grouping type, such that the groupings of the channels are different as between any given two of the grouping types;
- a detection section that detects, for each group, a maximal value of the signal levels of the input audio signals of the channels belonging to the same group; and
- an adjustment section that determines, for each group, a common amplification gain according to the detected maximum value and supplying the determined common amplification gain to the amplifiers of the channels belonging to the group so as to attenuate the level of the output audio signals if the maximum value exceeds a threshold level specified by the user,
- wherein said three or more channels of audio signals constitute a set of surround signals in an ordinary surround system and are grouped together into one or more groups during said group arrangement process, wherein each of the channels of audio signals belongs to only one of the groups,
- wherein, when the maximum signal level is below the threshold level, the adjustment process is performed to maintain the common amplification gain, when the maximum signal level exceeds the threshold level, the adjustment process is performed to attenuate the level of the input audio signals, and
- wherein the common amplification gain is determined such that the excess of the maximum value is suppressed in accordance with a ratio specified by the user.

16. The level adjustment method according to claim 9,
- wherein the group arrangement process is applied to audio signals of a surround system having a least six channels including a left channel, a right channel, a left surround channel, a right surround channel, a center channel and the LFE channel, and the group arrangement process arranges the channels into a first group including the left channel, the right channel, the left surround channel, the right surround channel and the center channel, and a second group including the LFE channel.

17. The level adjustment method according to claim 9,
- wherein the group arrangement process is applied to audio signals of a surround system having at least six channels including a left channel, a right channel, a left surround channel, a right surround channel, a center channel and an LFE channel, and the group arrangement process arranges the channels into a first group including the left channel, the right channel and the center channel, a second group including the left surround channel and the right surround channel, and a third group including the LFE channel.

18. The level adjustment method according to claim 9,
- wherein the group arrangement process is applied to audio signals of a surround system having at least six channels including a left channel, a right channel, a left surround channel, a right surround channel, a center channel and an LFE channel, and the group arrangement process arranges the channels into a first group including the left channel and the right channel, a second group including the left surround channel and the right surround channel, a third group including the LFE channel, and a fourth group including the center channel.

* * * * *